United States Patent [19]

Jeon

[11] Patent Number: 5,373,476
[45] Date of Patent: Dec. 13, 1994

[54] HIGHLY INTEGRATED SEMICONDUCTOR MEMORY DEVICE WITH TRIPLE WELL STRUCTURE

[75] Inventor: Jun-Young Jeon, Seoul, Rep. of Korea

[73] Assignee: Samsung Electronics Co., Ltd., Suwon, Rep. of Korea

[21] Appl. No.: 996,969

[22] Filed: Dec. 23, 1992

[30] Foreign Application Priority Data

Dec. 23, 1991 [KR] Rep. of Korea ............... 23942/1991

[51] Int. Cl.$^5$ ...................... H01L 27/02; H01L 27/10
[52] U.S. Cl. ..................... 365/226; 365/174; 365/181; 257/371; 257/369; 257/368; 257/296
[58] Field of Search ................. 365/226, 174, 181; 257/378, 182, 371, 368, 296

[56] References Cited

U.S. PATENT DOCUMENTS

| | | | |
|---|---|---|---|
| 4,907,058 | 3/1990 | Sakai | 257/296 |
| 5,079,613 | 1/1992 | Sawada et al. | 257/544 |
| 5,148,255 | 9/1992 | Nakazato et al. | 257/378 |
| 5,179,539 | 1/1993 | Horiguchi et al. | 365/226 |
| 5,281,842 | 1/1994 | Yasuda et al. | 257/371 |

*Primary Examiner*—Viet Q. Nguyen
*Attorney, Agent, or Firm*—Cushman, Darby & Cushman

[57] ABSTRACT

A highly integrated semiconductor memory device, such as a DRAM, is provided with a unique triple-well structure which results in reduced junction capacitance of transistors and a smaller body effect. The semiconductor memory device comprises first and second wells of a first conductivity type and a third well of a second conductivity type formed in a semiconductor substrate of the first conductivity type. The first well is formed in the third well and the first well and the second well are connected to receive a ground level Vss well bias voltage and a negative level $V_{BB}$ well bias voltage, respectively. A plurality of MOS transistors of the first conductivity type are formed in the third well and at least two series-connected MOS transistors of the second conductivity type are formed in the first well. A plurality of MOS transistors of the second conductivity type and a plurality of memory cells are also formed in the second well.

3 Claims, 3 Drawing Sheets

HIGHLY INTEGRATED SEMICONDUCTOR MEMORY DEVICE WITH TRIPLE WELL STRUCTURE

BACKGROUND OF THE INVENTION

1. Field of the Invention

The present invention relates to semiconductor memory devices, and more particularly to a dynamic random access memory device (DRAM) having a triple-well structure and which is capable of suppressing the body effect for transistors formed on a heavily doped substrate or well region. The triple-well structure is used to improve the isolation properties of transistors formed therewithin.

2. Description of the Related Art

In a semiconductor memory device such as a DRAM, in order to reduce the junction capacitance of a transistor and to improve isolation characteristics of peripheral devices and operating characteristics of a transistor, a negative voltage is supplied to a substrate or a well.

However, an increasing integrated circuit density results in the length of the transistor channel being shortened and the effective threshold voltage being lowered.

In order to protect against short channel effects, a heavily doped substrate or well is commonly used in highly integrated semiconductor memory devices.

If the absolute value of a negative backgate voltage $V_{BB}$ applied to the substrate or well region increases, the threshold voltage of the transistor formed therein rises resulting in a large body effect.

A 16 Mb DRAM produced by TOSHIBA Co. appears to overcome the effect of large threshold voltages by using a triple-well structure consisting of one N-type well and two P-type wells.

This TOSHIBA triple well-structure is different from conventional layouts having a twin-well structure consisting of one N-type well and one P-type well. Such a triple-well structure is disclosed in an article by Fujii et al, entitled "A 45 ns 16 Mb DRAM with Triple-Well Structure", ISSCC Digest of Technical Papers, Feb. 17, 1989, pp. 248-249.

FIG. 1 illustrates the TOSHIBA triple-well structure discussed above. As shown, N-type substrate 11 is used to simplify the fabrication process with an N-type well 13 and first and second P-type wells 12 and 14 formed therein.

A PMOS transistor 16 constituting a peripheral circuit portion and a memory cell array portion is formed in the N-type well 13.

A well bias voltage (or a backgate voltage) from power supply voltage Vcc is applied to N+ region 21 in N-type well 13 and to P+ region 22 of the PMOS transistor 16.

The NMOS transistor 15 constituting the peripheral circuit portion is formed in the first P-type well 12. Because a well bias voltage of ground voltage level Vss is applied to P+ region 23 within first P-type well 12, a large body effect can be suppressed. Thus, any upward change in the effective threshold voltage of the NMOS transistor 15 is foregone.

A memory cell array portion comprising the NMOS transistor 17 and an associated capacitor is formed in the second P-type well 14.

A well bias voltage of negative backgate voltage level $V_{BB}$ is applied to the P+ ion implanted region 24 in the second P-type well 14 as shown in FIG. 1. As a result, data retention and transistor isolation characteristics are improved.

However, because the NMOS transistor 15, associated with the peripheral circuit portion of the memory device, is formed in the first P-type well 12 in which a ground voltage level Vss corresponding to the well bias voltage is applied, the junction capacitance of the NMOS transistor 15 is increased.

Hence, the operating speed of the peripheral circuit portion is reduced and the isolation characteristics are deteriorated.

Consequently, the distance between transistors along the peripheral circuit portion of the memory device must be enlarged resulting in the chip layout area becoming increased.

Furthermore, because a well bias voltage of ground voltage level Vss is applied, the respective transistor threshold voltages vary and a latch-up phenomenon resulting from noise in the ground voltage are liable to be generated.

In addition, the use of an N-type substrate requires that an N-type well be formed having a deep junction along an input/output pad. This is very difficult to achieve particularly when this portion of the chip is to be used as an input protection device.

FIG. 2 illustrates another conventional triple-well structure. The use of P-type substrate 31 for the substrate of the device of FIG. 1 is found to more easily facilitate the formation and use of the chip as an input protection device.

However, because the first P-type well 32 formed along a peripheral circuit portion of the chip has the same construction as the first P-type well 12 of FIG. 1, the operating speed remains slow and the chip layout area is increased.

Moreover, variations in threshold voltage and the latch-up phenomenon are similarly engendered as in the chip layout of FIG. 1.

The second P-type well 35 having a high impurity concentration is formed in the N-type well 34 and a well bias voltage of negative voltage level $V_{BB}$ is applied thereto.

In the high impurity concentration well 35, as the absolute value of the applied negative voltage increases, the transistor threshold voltage increases as well due to the body effect.

Generally, the degree of increase in transistor the threshold voltage varies depending on the state of data ("1" or "0") stored in the corresponding memory cell area.

In addition, during the chip fabrication process, because the corresponding memory cell area is formed in a twin-well consisting of N-type well 34 and second P-type well 35, silicon crystal defects may occur which deteriorate memory cell data retention capacity.

SUMMARY OF THE INVENTION

Accordingly, it is an object of the present invention to provide a highly integrated semiconductor memory device having a triple-well structure with reduced junction capacitance.

It is another object of the present invention to provide a highly integrated semiconductor memory device having a triple-well structure with improved isolation properties between active devices without compromising the area of the integrated circuit chip.

It is a further object of the present invention to provide a highly integrated semiconductor memory device having a triple-well structure for suppressing chip defects due to body effects of transistors.

According to the present invention, a semiconductor memory device is provided having first and second wells of a first conductivity type and a third well of a second conductivity type formed on the semiconductor substrate of a first conductivity type.

The first and second wells are connected to receive a respective well bias voltage, MOS transistors of the first conductivity type are formed in the third well, and at least two series-connected MOS transistors of the second conductivity type are formed in the first well.

Moreover, MOS transistors of the second conductivity type, not including MOS transistors formed in the first well, and memory cells, are formed in the second well.

A power voltage is applied to the third well, and a ground voltage and a negative voltage are applied to the first and second wells, respectively.

BRIEF DESCRIPTION OF THE DRAWINGS

The objects, advantages and features of the invention will be more apparent from the following detailed description with reference to the attached drawings, in which.

DETAILED DESCRIPTION OF THE PREFERRED EMBODIMENT

Figure 3:
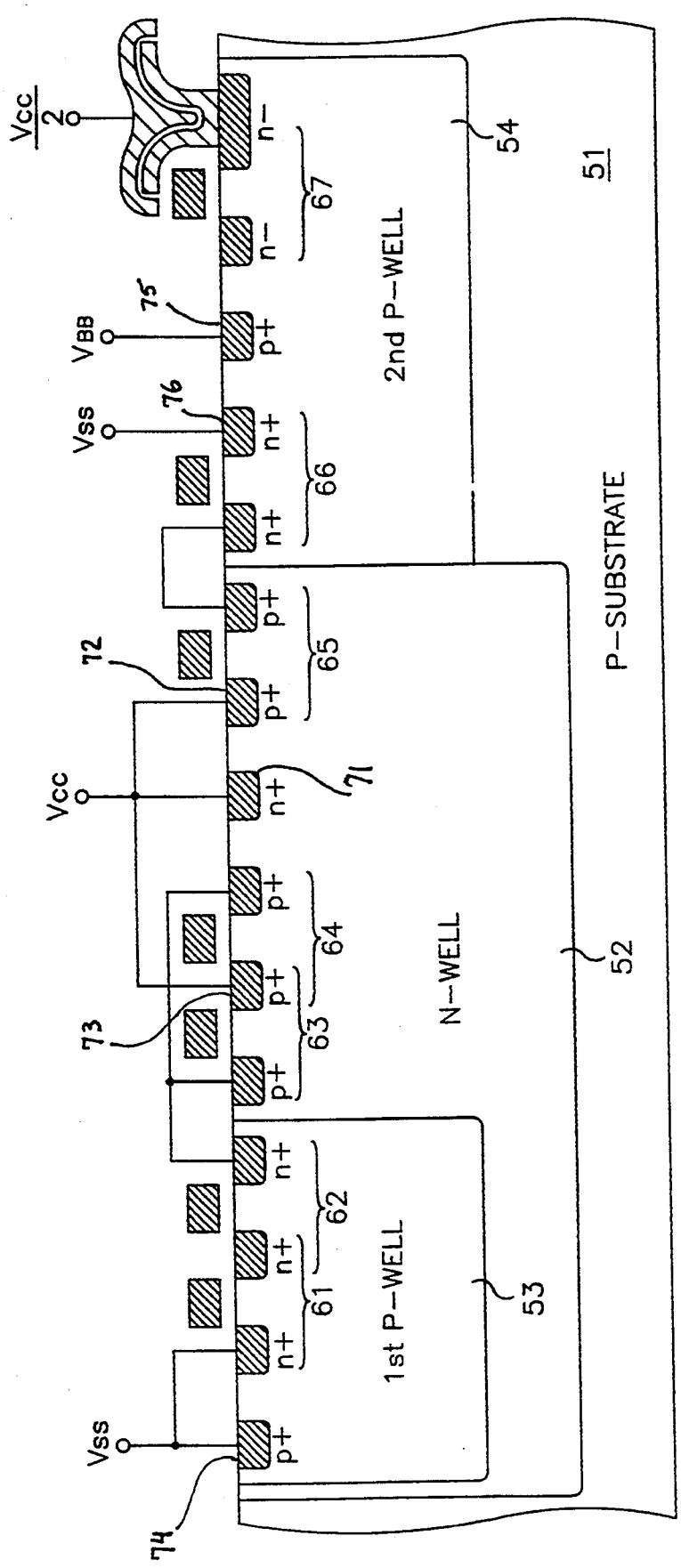
FIG. 3 is a cross-sectional view of a triple-well structure along with appropriate well bias voltages according to the present invention.

FIG. 3 shows a triple-well structure formed in a P-type substrate 51. The first P-type well 53 and the PMOS transistors 63, 64 and 65 are shown formed in the N-type well 52. The PMOS transistors 63, 64 and 65 constitute a memory cell array portion and a peripheral circuit portion of an integrated circuit memory device.

A well bias voltage of power supply voltage level Vcc is applied to an N+ region 71 of N-type well 52.

Moreover, power supply voltage level Vcc is applied to a P+ region 72 of the PMOS transistor 65 and to a P+ region 73 of the PMOS transistors 63 and 64. A well bias voltage of ground voltage level Vss is applied to a P+ region 74 of the first P-type well 53.

Series-connected NMOS transistors 61 and 62 are formed in the P-type well 53 (may include more than two transistors). A first P-type region 53 is formed in the area in N-type well 52 away from the PMOS transistors 63, 64 and 65.

A second P-type well 54 is formed in contact with the P-type substrate 51. NMOS transistors 66 and 67 constitute portions of the memory cell array and the peripheral circuit regions of the memory device of the present invention and are formed within the second P-type well 54. A well bias voltage of negative voltage level $V_{BB}$ is applied to a P+ region 75.

An N+ region 76 of the NMOS transistor 66 is connected to ground voltage level Vss. At least some of the NMOS transistors in the peripheral circuit portion of the memory device of the present invention are formed in first P-type well 53 but most are formed within the second P-type well 54.

NMOS transistors associated with logic elements most susceptible to noise due to body effect are formed in the first P-type well 53.

In the first P-type well 53, at least two NMOS transistors are serially connected. However, even if the P-type well 53 is of a high impurity concentration, because the well bias voltage is at ground voltage level Vss, changes in the NMOS transistor threshold voltage will be suppressed.

Furthermore, because a well bias voltage of a negative voltage level $V_{BB}$ of approximately less than $-2$ V is applied to the second P-type well 54, the junction capacitance of the NMOS transistors 66 and 67 is reduced. Thus, the operation of the peripheral circuit portion and the processing speed of data can be significantly improved.

Figure 1:
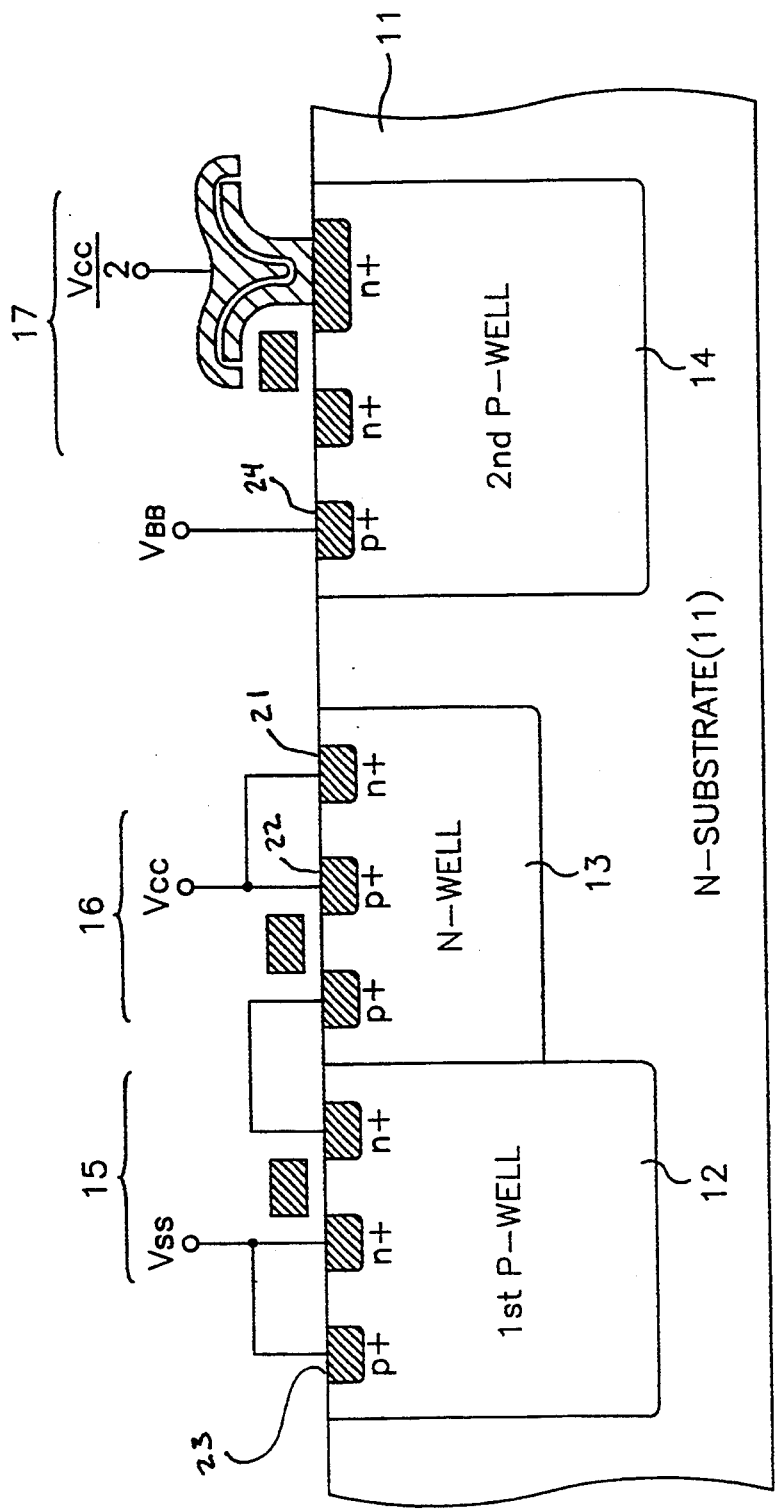
FIG. 1 is a cross-sectional view showing a first example of a conventional triple-well structure along with appropriate well bias voltages.
Figure 2:
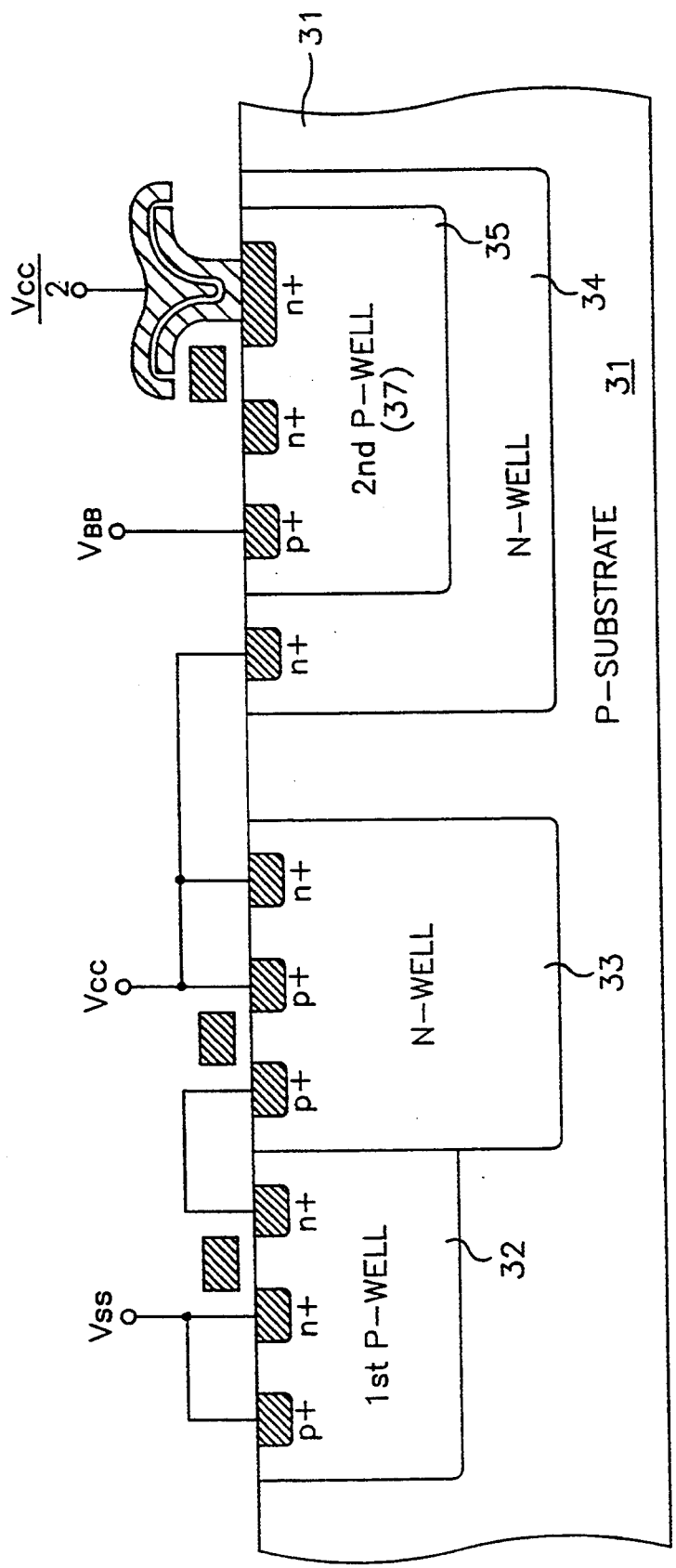
FIG. 2 is a cross-sectional view showing another example of a conventional triple-well structure along with appropriate well bias voltages.

In addition, because the section of the memory cell area portion including the second P-type well 54 is not a twin-well structure, it becomes unnecessary to increase the impurity concentration of the second P-type well 54. As a result, the body effect is decreased in comparison with that of the prior art triple-well structures shown in FIGS. 1 and 2.

Furthermore, the isolation characteristic of the NMOS transistor 66 is similarly improved as a negative voltage is applied to the second P-type well 54 allowing the distance between the transistors in the second P-type well 54 to be made small.

Thus, the resultant layout area is less than would otherwise be the case if all NMOS transistors in the peripheral circuit portion were to be formed in the first P-type well 53 for which a well bias voltage would be applied of ground voltage level Vss.

Because the second P-type well 54 is not formed as a twin-well structure, formation of silicon crystal defects formed during chip fabrication are significantly reduced. As a result, the data retention capability of the memory device formed in accordance with the present invention is much improved.

Furthermore, because a P-type substrate 51 is used, the N-type well structure 52 can be used as a portion of an input protection circuit of an input/output pad to improvedly handle the ill-effects of static electricity.

Hence, a memory device designed with a triple-well structure as shown in FIG. 3 will have improved memory data retention capacity and will provide better isolation properties between transistors than would otherwise be possible with conventional triple-well or twin-well structures.

The resultant structure also provides a lower junction capacitance, increasing operating chip speed and suppressing a latch-up phenomenon.

Furthermore, because at least two series-connected NMOS transistors 61, 62 are formed in the P-type well 53 for which a well bias voltage of ground voltage level Vss is applied thereto, the body effect is suppressed and a stable chip characteristic can be obtained.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor memory device comprising:

first and second wells of a first conductivity type and a third well of a second conductivity type formed in a semiconductor substrate of said first conductivity type;

said first well being formed in said third well and said first well and said second well being connected to receive a first well bias voltage and a second well bias voltage, respectively;

at least one MOS transistor of said first conductivity type formed in said third well;

at least two series-connected MOS transistors of said second conductivity type formed in said first well; and at least one MOS transistor of said second conductivity type and at least one memory cell formed in said second well.

2. A semiconductor memory device as claimed in claim 1, wherein said first, second and third wells are for coupling to a ground voltage supply, to a negative voltage supply, and to a power voltage supply, respectively.

3. A semiconductor memory device as claimed in claim 1, wherein each of said at least one memory cell comprises a transistor and a capacitor.

* * * * *